United States Patent [19]

Metz

[11] Patent Number: 4,572,967

[45] Date of Patent: Feb. 25, 1986

[54] BIPOLAR ANALOG SWITCH

[75] Inventor: Arthur J. Metz, Gervais, Oreg.

[73] Assignee: Tektronix, Inc., Beaverton, Oreg.

[21] Appl. No.: 415,070

[22] Filed: Sep. 7, 1982

[51] Int. Cl.[4] .................... H03K 17/30; H03K 17/60
[52] U.S. Cl. .................................. 307/243; 328/176;
328/154; 328/104; 330/252
[58] Field of Search ................ 330/252, 156; 307/243,
307/254, 255, 455, 482, 299 A, 490; 328/154,
176, 137, 104, 105

[56] References Cited

U.S. PATENT DOCUMENTS

| | | | |
|---|---|---|---|
| 3,783,307 | 1/1974 | Breuer | 307/243 |
| 3,868,580 | 2/1975 | Battjes | 330/18 |
| 4,367,419 | 1/1983 | Yazawa et al. | 307/254 |

FOREIGN PATENT DOCUMENTS

| | | | |
|---|---|---|---|
| 0138265 | 2/1978 | Japan | 307/254 |
| 0118229 | 9/1980 | Japan | 307/243 |
| 0116328 | 9/1981 | Japan | 307/243 |

OTHER PUBLICATIONS

I. K. Krylov et al., Instrument and Experiment Technology, (USA) vol. 20, No. 4, p. 1, Jul.-Aug. 1977, "Integrated Circuit Analog Switch".

"Pulse, Digital and Switching Waveforms", by Jacob Millman et al., pp. 535–540.

"An Introduction to Operational Amplifiers with Linear IC Applications", by Luces Faulkenberry, copyright 1977, pp. 28–30.

"Amplifier Handbook", by Richard Shea, copyright 1966, pp. 17–28, McGraw Hill Book Company.

Primary Examiner—Stanley D. Miller
Assistant Examiner—Richard Roseen
Attorney, Agent, or Firm—George T. Noe

[57] ABSTRACT

An improved bipolar analog switch comprising selectable emitter-coupled pairs of bipolar transistors in combination with an emitter follower output bipolar transistor is provided with means for matching operating characteristics of the selected emitter-coupled pair to eliminate thermal distortion and to provide precise signal replication. Also, a simplified TTL-compatible digital switch control circuit is provided.

10 Claims, 3 Drawing Figures

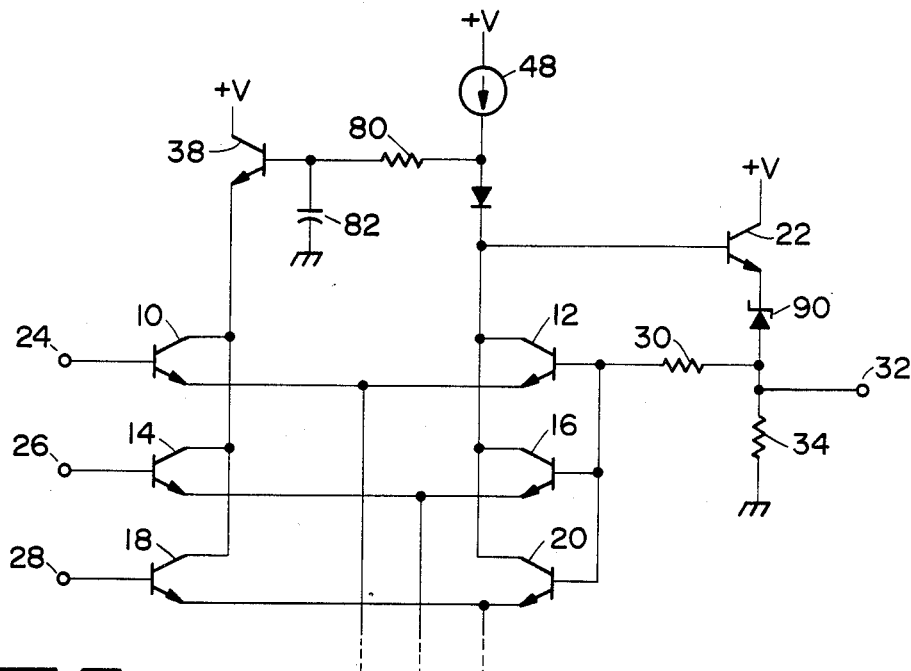
_Fig. 2._
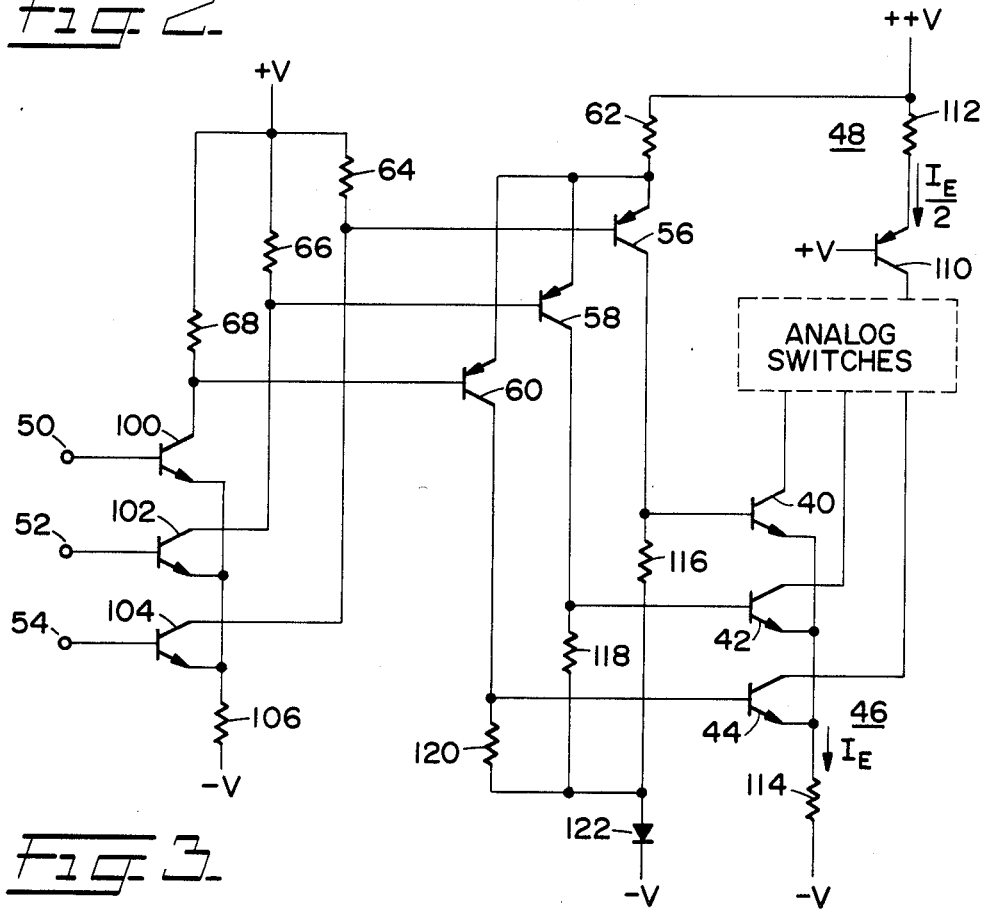
_Fig. 3._

BIPOLAR ANALOG SWITCH

BACKGROUND OF THE INVENTION

The present invention relates generally to transistor switching networks, and in particular to a logic-controlled bipolar analog switch.

It is well known in the art to utilize transistor switches in analog signal paths for selectively connecting an analog signal therethrough. One example of the use of such analog switches is the so-called vertical switching circuit of a multiple-channel oscilloscope wherein one of a plurality of signal-processing channels is selectively connected to the vertical deflection system for display. For precise transmission of such signals, it has been popular to use field-effect transistors because when turned on, a signal may be passed from source to drain in an undistorted, although perhaps slightly attenuated, form. However, field-effect transistors have comparatively slow switching speeds, and moreover, field-effect transistors do not lend themselves very well to realization in integrated-circuit form.

One form of analog switch capable of high-speed switching operation and realization in integrated-circuit form is the analog transmission gate taught in U.S. Pat. No. 3,783,307 to David R. Breuer. This so-called analog transmission gate comprises emitter-coupled pairs of bipolar transistors, which, when both transistors of a pair are turned on by supplying emitter current thereto, operate in conjunction with an emitter follower to pass an analog signal to an output terminal. While the bipolar transistor technology permits high-speed switching for the analog transmission gate, fidelity of the analog signals transmitted therethrough is questionable because of gain uncertainties, offset voltages, thermal conditions, and other physical characteristics of the transistor junctions which may result in signal distortion.

Moreover, the digital switch control circuits of the prior art for selecting the appropriate signal path switch are rather complex, requiring many transistors and combinations of logic signals for operation thereof.

SUMMARY OF THE INVENTION

In accordance with the present invention, a bipolar analog switch comprising selectable emitter-coupled pairs of bipolar transistors in combination with an emitter follower output bipolar transistor is provided with certain improvements which increase signal fidelity and which simplify digital switch control. A bootstrap emitter follower transistor is coupled via a diode from the collector of the output transistor of a given emitter-coupled pair to the collector of the input transistor so as to match the collector voltages (and thus power dissipation) and thereby eliminate the effects of thermal distortion caused by self heating due to switching or signal transients. The diode, which is connected in series with a constant current source, matches the base-emitter junction of the bootstrap emitter follower transistor both in terms of the voltage drop thereacross and in allowing distortion producing mechanisms such as those caused by heating to track. Because input signal source impedances will result in voltage offsets due to base current at the input transistor bases any may affect gain, a resistor is placed between the base of the output transistor of each pair and the emitter of the emitter follower transistor to match the input source impedance. In the switch control circuit, a single constant current sink is connected to the emitters of a plurality of transistor switches, each of which is controlled by a single digital input, to selectively control one or more of the emitter-coupled pairs.

It is therefore one object of the present invention to provide an improved bipolar analog switch exhibiting precise signal replication therethrough.

It is another object of the present invention to provide an improved bipolar analog switch having a simplified switch control circuit.

It is another object of the present invention to provide a bipolar analog switch having improved performance characteristics including a very high input impedance.

It is a feature of the present invention to provide a bipolar analog switch in which thermal distortion is eliminated.

Other objects, features, and advantages of the present invention will become apparent to those having ordinary skill in the art upon a reading of the following description of the preferred embodiment taken in conjunction with the drawing.

BRIEF DESCRIPTION OF THE DRAWINGS

FIG. 2 shows an alternative bootstrap circuit configuration for the analog switch; and FIG. 3 shows an alternative switch control circuit configuration.

DETAILED DESCRIPTION OF THE PREFERRED EMBODIMENT

Figure 1:
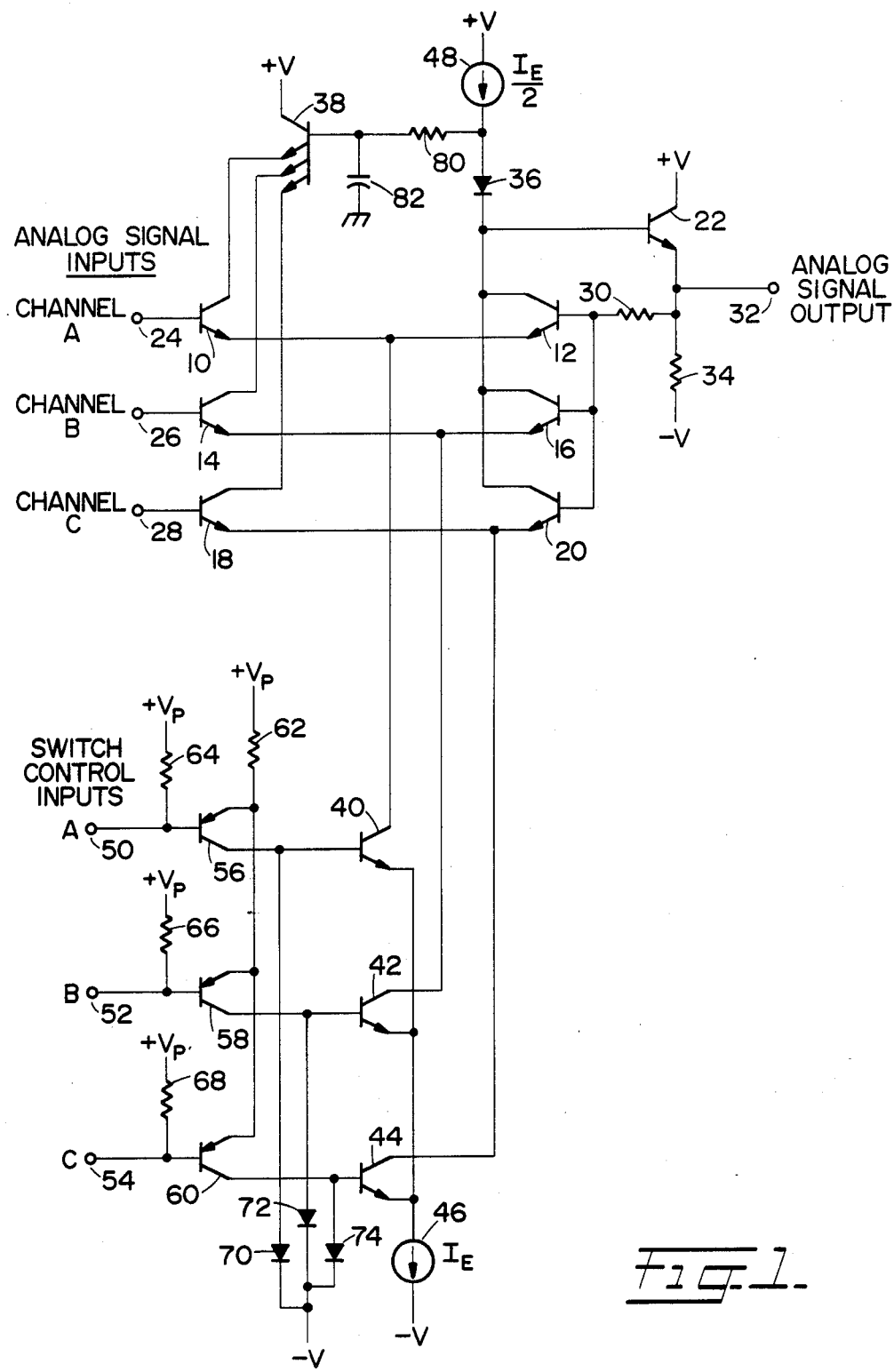
FIG. 1 is a schematic of a bipolar analog switch in accordance with the present invention.

In FIG. 1, a bipolar analog switch is shown in which a plurality (three in this example) of emitter-coupled pairs of bipolar transistors 10–12, 14–16, and 18–20 are selectively operated with an emitter-follower output bipolar transistor 22 to form a unity-gain voltage follower having a high input impedance and a low output impedance. Input analog voltage signals from channels A, B, and C are applied via input terminals 24, 26, and 28 to the bases of transistors 10, 14, and 18, respectively. The bases of transistors 12, 16, and 20 are connected together through a resistor 30 to the emitter of transistor 22, which is also connected to an output terminal 32 and to a suitable negative voltage supply through an emitter resistor 34. The purpose of resistor 30 is to compensate series impedance in the input signal source, thereby to eliminate any voltage offset due to base current and to eliminate beta dependence of gain. The collectors of transistors 12, 16, and 20 are connected together in common to the base of transistor 22, and are further coupled via a bootstrap path including diode 36 and transistor 38 to the separate collectors of transistors 10, 14, and 18. This bootstrapping technique in conjunction with the constant current bias arrangement results in a very high impedance as seen at the bases of transistors 10, 14, and 18.

The common emitters of transistors 10 and 12 are connected to the collector of transistor 40. Similarly, the common emitters of transistors 14–16 and 18–20 are connected respectively to the collectors of transistors 42 and 44. The emitters of transistors 40, 42, and 44 are connected in common to a constant current sink 46. Thus, transistors 40, 42, and 44, when turned on, conduct operating current to the emitter-coupled pairs of transistors 10–12, 14–16, and 18–20, respectively, thereby to control operation of the analog switch. A constant current source 48 provides collector current for transistors 12, 16, and 20. In the preferred embodiment the current provided by constant current source 48 is equal to one-half the current required by current sink 46, so that the other one-half of the required current is provided by transistor 38. This means that for operation of the analog switch, the two transistors of a given emitter-coupled pair conduct evenly because the emitter current is split into two equal halves.

Switch control for selectively activating transistors 40, 42, and 44, and consequently the respective emitter-coupled pairs connected thereto, is provided by digital switch control input signals applied via input terminals 50, 52, and 54 to the bases of transistors 56, 58, and 60 respectively. The emitters of transistors 56, 58, and 60 are connected in common to a suitable positive voltage supply $+V_p$ through an emitter resistor 62. Pull-up resistors 64, 66, and 68 are connected between the positive voltage supply $+V_p$ and the respective bases of transistors 56, 58, and 60, shown to be NPN conductivity type, to hold these transistors in a normally biased-off condition. Thus, the switch-activating signal applied to input terminals 50, 52, or 54 is negative going. However, it is understood that positive-going switch-activating signals could be used by employing NPN conductivity-type transistors for devices 56, 58, and 60 and reversing the polarity of the voltage supply $V_p$.

The collectors of transistors 56, 58, and 60 are connected respectively to the bases of transistors 40, 42, and 44, and through diodes 70, 72, and 74 to the negative voltage supply. It should be noted that diodes 70, 72, and 74 are connected in shunt with the base-emitter junctions of transistors 40, 42, and 44, respectively, and therefore provide temperature compensation as well as perform a biasing function for these transistors.

Thus, it can be discerned that the switch control circuit is greatly simplified over conventional techniques, and that switch selection is effected by a typical TTL (transistor-transistor logic) interface. For example, to select the analog signal of Channel A to be made available at output terminal 32, a negative-going switch control signal is applied to terminal 50, pulling the base of transistor 56 low, causing current to flow through resistor 62 and diode 70, turning on transistor 40, which is turn causes transistors 10 and 12 to conduct.

As mentioned previously, diode 36 and transistor 38 form a bootstrap path from the collector of transistor 12 (assuming that emitter-coupled pair 10-12 is conducting) to the collector of transistor 10 so that the collector-to-base voltage of the emitter-coupled pair (10-12 in this example) is equal. This, in conjunction with the constant current through both transistors, results in equal and constant power dissipation, and therefore thermal distortion in the emitter-coupled pair is eliminated. Thermal distortion effects of transistor 22 are neglible because the base-emitter junction thereof is in the feedback loop of transistor 12. The resistance of resistor 30 is chosen to be equal to the source resistance, as mentioned hereinabove, to minimize offset and gain loss effects between the two bases of the conducting emitter-coupled pair. Because the emitter and collector currents, collector voltages, power dissipation, and base resistance of the two transistors of a given conducting emitter-coupled pair are equal, gain of the stage is equal to exactly one, and thus very precise signal replication is provided thereby. Of course, gains greater than one can be achieved by connecting a resistor from the common bases of transistors 12, 16, and 20 to ground. Resistor 80 and capacitor 82 in the bootstrap circuit establish the transient response of the amplifier. Also because of the balanced condition, turn-on thermal distortion of the switch is eliminated, and settling time for the switch is very short, so that high speed switching may be effected.

Transistor 38 is shown in FIG. 1 as a single transistor having three separate emitter base junctions, in accordance with conventional integrated-circuit fabrication techniques, although three separate transistors could be used just as well. The separate emitters of transistor 38 effectively disconnect the collectors of transistors 10, 14, and 18 to prevent input loading and signal distortion resulting from current being injected into one side of the bootstrap circuit in the event that signals to the inactive transistors go sufficiently positive to forward bias the collector-base junctions thereof. In FIG. 2, an alternate bootstrap configuration is shown in which transistor 38 has a single emitter connected to the common collectors of transistors 10, 14, and 18, and a voltage dropping device of suitable size, such as a Zener diode 90, is connected between the emitter of transistor 22 and the output terminal 32. The device 90, which could also be a string of diodes or even a battery, effectively raises the collector voltages of all of the transistors 10-20 of the switch to increase the level of input voltage required to forward bias the collector-base junctions of the inactive inputs, thereby increasing the amplitude window of the input signal.

FIG. 3 shows an alternative switch control circuit configuration in which transistors 100, 102, and 104 of NPN conductivity type are inserted between switch control input terminals 50, 52, and 54 and the bases of transistors 56, 58, and 60, respectively, to facilitate positive-going input voltage selection. The emitters of transistors 100, 102, and 104 are connected in common through a resistor 106 to the negative supply. It should be pointed out that a one-to-one correspondence between switch control inputs and channels to be switched is not necessary, as seems to be implied by the shown embodiments. Encoding techniques for reducing the number of switch control inputs are well known in the art and may be employed if desired. Constant current source 48 comprises a transistor 110 and emitter resistor 112, and the constant current sink 46 is actually a current mirror comprised of a single resistor 114 connected to the common emitters of transistors 40, 42, and 44 and bias resistors 116, 118, and 120 connected from the respective bases of transistors 40, 42, and 44 to a single compensation diode 122. In this configuration the switch selection current through resistor 62 (and hence through one of transistors 56, 58, or 60) tracks as a constant ratio of the source current through resistor 112, even if PNP transistor beta is poor, as is often the case for integrated circuits. And since resistor 62 supplies the bias current for the current mirror transistors 40, 42, and 44, the desired one-half ratio of current through resistor 112 tracks the current through resistor 114 so as to maintain the equal current conduction through the two halves of the conducting analog switch.

In summary, it can be seen that an improved bipolar analog switch has been shown and described herein. It will be obvious to those having ordinary skill in the art that many changes may be made in the details of the hereinabove-described preferred embodiment of the present invention. Therefore, the scope of the present invention should be determined only by the following claims.

What I claim as being novel:

1. A switching circuit, comprising:

a plurality of emitter-coupled pairs of transistors, each pair consisting of a first transistor having a collector, a base, and an emitter and a second transistor having a collector, a base, and an emitter, wherein the respective bases of said first transistors are coupled separately to a plurality of input terminals and the bases of said second transistors are connected in common, and further wherein the collectors of said second transistors are connected in common;

an output terminal coupled to the common-connected bases of said secon transistors;

a feedback loop coupled from the common collectors of the second transistors to the common bases thereof;

bootstrap means coupled from the collectors of said second transistors to the collectors of said first transistors for maintaining all of the collectors of said first and second transistors at the same potential;

means coupled to said plurality of emitter-coupled pairs of transistors for selectively energizing with a constant current each of said plurality of emitter-coupled pairs of transistors one at a time; and means coupled to said plurality of emitter-coupled pairs of transistors for splitting said constant current equally between the first and second transistor of the energized pair.

2. A switching circuit in accordance with claim 1 wherein said bootstrap means comprises at least one semiconductor junction coupled to a current source and connected in series with the collectors of said first transistors and at least one semiconductor junction coupled to said current source and connected in series with the collectors of said second transistors, said semiconductor junctions being arranged in parallel and coupled to a current source.

3. A switching circuit in accordance with claim 2 wherein said semiconductor junction in series with the collectors of said first transistors comprises the base-emitter junction of a bootstrapping transistor and the semiconductor junction in series with the collectors of said second transistors comprises a diode.

4. A switching circuit in accordance with claim 3 wherein said bootstrap means further comprises and RC frequency compensating network interposed between the base of said bootstrapping transistor and the junction of said current source and said diode.

5. A switching circuit in accordance with claim 3 wherein said bootstrapping transistor includes a separate base-emitter junction connected to each of the respective collectors of said plurality of first transistors.

6. A switching circuit in accordance with claim 3 wherein all of the collectors of said first transistors are connected in common, and said bootstrapping transistor includes a single base-emitter junction connected to the common collectors of said first transistors.

7. A switching circuit in accordance with claim 6 wherein said feedback loop includes means for elevating the collector potential of said first and second transistors.

8. A switching circuit in accordance with claim 1 wherein said selective energizing means comprises a constant current generator and switch control circuit means including a plurality of selectable current steering transistors, each one of which is connected respectively to the emitters of one of said plurality of emitter-coupled pairs for directing said constant current in response to switch selection input signals.

9. A switching circuit in accordance with claim 8 wherein said current splitting means comprises a second constant current generator connected in series with the collectors of said second transistors, said second constant current generator supplying one-half the current required by the current generator of said selective energizing means.

10. A switching circuit in accordance with claim 1 further comprising predetermined impedance means coupled between the common bases of said second transistors and said output terminal to match the input source impedance coupled to the bases of said first transistors.

* * * * *